United States Patent [19]
Green et al.

[11] Patent Number: 5,280,205
[45] Date of Patent: Jan. 18, 1994

[54] FAST SENSE AMPLIFIER

[75] Inventors: Robert S. Green; Thomas H. Moy, both of Boise, Id.

[73] Assignee: Micron Technology, Inc., Boise, Id.

[21] Appl. No.: 869,810

[22] Filed: Apr. 16, 1992

[51] Int. Cl.⁵ .............................................. G11C 7/06
[52] U.S. Cl. .................................. 307/530; 307/247.1; 365/205
[58] Field of Search ...................... 307/247.1, 350, 530; 365/189.06, 203, 205, 208

[56] References Cited

U.S. PATENT DOCUMENTS

| | | |
|---|---|---|
| 4,128,773 | 12/1978 | Troutman et al. .................. 307/238 |
| 4,144,590 | 3/1979 | Kitagawa et al. ................... 307/530 |
| 4,475,178 | 10/1984 | Kinoshita ............................. 365/205 |
| 4,616,342 | 10/1986 | Miyamoto ........................... 365/205 |
| 4,785,206 | 11/1988 | Hoshi .................................. 307/530 |
| 4,858,193 | 8/1989 | Furutani et al. ..................... 307/530 |
| 4,973,864 | 11/1990 | Nogami ............................... 365/205 |

*Primary Examiner*—William L. Sikes
*Assistant Examiner*—Shawn Riley

*Attorney, Agent, or Firm*—Dorr, Carson, Sloan & Peterson

[57] ABSTRACT

An integrated circuit sense amplifier includes a pair of complementary inputs for receiving a pair of complementary data signals which are input to a CMOS flip-flop having its output nodes connected to a logic low through a first transistor and its high side connected to a logic high through a second transistor. The first transistor is on when data signals are not being sensed, holding the nodes in a no-current, logic low state. The first transistor turns off and the second transistor turns on just prior to the arrival of a signal, precharging the nodes to an intermediate voltage, permitting the flip-flop to latch more quickly to a full-logic output when the signal arrives. A preamp may be interposed between the complementary inputs and the latch. The preamp inputs and outputs are precharged to voltage levels near or between their anticipated final levels, so that they reach their final levels quickly when the data signal arrives. The flip-flop output nodes may be connected to a tristate output circuit, which is also precharged to an intermediate level, enabling it to reach its full output more quickly.

17 Claims, 5 Drawing Sheets

FAST SENSE AMPLIFIER

BACKGROUND OF THE INVENTION

1. Field of the Invention

The invention in general relates to integrated circuit memories and more particularly to a fast sense amplifier incorporated into such circuits.

2. Statement of the Problem

Integrated circuit memories generally contain a two dimensional array of storage cells arranged in rows and columns. As is well-known, integrated circuit memories are generally mass produced by fabricating hundreds of identical circuit patterns on a single semiconducting wafer, which wafer is subsequently sawed into hundreds of identical dies or chips. The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, the smaller the size of the individual cell, the smaller the size of the individual electrical components in the cell, and the smaller the electrical signals associated with them. Thus the signals produced by individual cells are much too small to be used by external circuitry. Thus, sense amplifiers are generally built into memory integrated circuits to sense the signals and to amplify them to a level where they can be utilized by an external circuit. In order to amplify the signal sufficiently, prior art memory sense amplifiers have generally included two or more stages of amplification. Since amplifier circuits generally only provide a certain gain to a signal, and the input signal can vary, the particular voltage levels of the output signals are not generally a constant voltage. Thus the amplifier stages are generally followed by an invertor stage to "drive the voltage to the rails", that is, to drive the voltage to the full voltage differential of the external circuit. Generally, integrated circuits are binary logic circuits, where the voltages represent complementary logic values that are alternately referred to as "true and false", "logic 1 and logic 0", or "logic high and logic low", the latter of which shall generally be used herein. Finally, sense amplifiers often will have an output stage that produces a tristate output: i.e. high, low and off, since this allows individual circuits to be tied together.

As more, and more individual storage cells are placed onto a single chip, the length of the electrical lines connecting the individual cells to the amplifiers becomes longer and longer as compared to the individual cell size, and the capacitance associated with the lines becomes larger. This combination of small signals and lines with large associated capacitance results in long times for useful signal levels to rise on the lines. As is well known, speed is an important factor in such memories, since the faster the cells can be read, the faster is the computer of which the memory is a part, and the more operations the computer can do. Thus in order to enhance the speed of reading cells, memory sense amplifiers must be very fast. However, as is well known in the art, to be fast, transistors generally must be relatively large. Thus transistors used in the sense amplifier circuits are typically larger than the transistors in the individual cells and thus occupy a significantly larger part of the integrated circuit. Thus sense amplifier circuits that include two or mores stages of amplification plus an invertor stage can significantly increase the integrated circuit size. Therefore there is a need for a sense amplifier circuit that can drive the voltage to the rails and yet is relatively simple.

Moreover, each stage in an amplifier adds additional response time, since it takes time for the logic of each stage to rise to full voltage. Thus it would be highly desirable to have a sense amplifier that could push the voltage to the rails in two or less stages.

For many applications of integrated circuit memories, such as for portable computers and other battery powered intelligent devices, the amount of power available is limited. Thus it is important that sense amplifiers not only are fast and small, but also consume a minimum of current. Thus many sense amplifiers are designed to be in an "off" or no-current-drain condition when data is not being read.

However, this means that the amplifier must come "on" before it can read the signals. This again takes time. Thus it would be highly desirable to have a sense amplifier that can quickly push a voltage to the rails from a no-current-drain condition.

The sense amplifier according to the invention shall be illustrated as implemented in a static random access memory (SRAM), which is a common type of integrated circuit memory. The cells in SRAM circuits are arranged in an array of rows and columns with all the cells in a given column connected to an electrical line called the bit line. Each cell contains a flip-flop, and data is stored in the cell by latching the flip-flop in either a logic 0 or a logic 1 state. When a read signal is input to the array requesting the data in a particular cell, the data is read out as either a logic 0 or a logic 1 on the bit line associated with the particular cell. In a SRAM each bit line is actually a pair of complementary lines, that is a "positive" or "logic 1" line and a "negative" or "logic 0" line, and the differential signal between the lines is read to determine the state of the flip-flop. Sense amplifiers have long been incorporated into SRAM memories to read these differential signals, and a common design is to include one sense amplifier per bit line pair, that is, per column in the array. Or decoders may be built into the circuit each of which connects a pair of bus lines associated with the decoder to any one of a multiple of bit lines, with one sense amplifier associated with each decoder. Whatever the particular design, there is a need for a simple, fast SRAM sense amplifier that can push the differential voltage on the associated bit or bus line to the rails in one or two stages from a no-current-drain status.

3. Solution to the problem

The present invention solves the above problems by providing a sense amplifier that drives the voltage to the rails in two or less stages.

The invention in addition provides a sense amplifier that can drive the voltage to the rails very quickly from a no-current-drain condition. It can in fact provide an output useable by an external device within 2 ns of a typical cell-level signal being provided at the input, which is 1 ns to 3 ns faster than prior art sense amplifiers.

The invention provides the above features by utilizing a clocked latch rather than a second stage of amplifier. That is, in an SRAM, the time when a cell read signal will be arriving at the inputs of the sense amplifier, is always accurately known, since the output is in response to a READ signal received by the SRAM. Further, computers and computer memories always operate according to well-defined clock cycles, and the read signal always arrives a well-defined time in the clock cycle. The invention uses the read timing signals to permit the latch to remain in a low logic level, no-current-drain state when no signal is being sensed and precharges the latch just prior to a signal arriving, which in effect, causes the latch to begin the process of setting itself even before the signal on the input line is large enough for the sense amplifier to produce a useable output.

The invention also accomplishes the above features by providing a sense amplifier circuit in which the pair of output signals begin to rise from a zero voltage before a full input signal is available. The pair of signals rise together to about half the full voltage before the input signal causes them to separate, and go to the rails, with one falling to zero and the other rising to the full system voltage. Thus, to produce the desired output signal difference, the individual signals must only change by half as much as one of them would have had to change if they had started at zero when the input signal had reached a value high enough to trigger the sense amplifier.

SUMMARY OF THE INVENTION

The invention provides an integrated circuit sense amplifier comprising: timing signal input means for receiving one or more timing signals; a pair of complementary inputs for receiving a complementary pair of data signals; input precharge means responsive to the timing signal for creating a signal level on the complementary inputs near the expected signal levels of the complementary data signals prior to the arrival of the complementary data signals; and latch means responsive to the complementary data signals for producing a full logic output signal. Preferably, the input precharge means further comprises means for clamping the complementary inputs to the same signal level prior to the arrival of the complementary data signals. Preferably, the amplifier further comprises: a preamplifier located between the complementary inputs and the latch, having a pair of preamplifier outputs, and including means for preamplifying the complementary data signals to produce a complementary pair of preamplifier output signals on the preamplifier outputs; and preamplifier output precharge means responsive to the timing signal for creating a signal level on the preamplifier outputs between the expected signal levels of the complementary preamplifier output signals prior to the arrival of the complementary data signals. Preferably, the preamplifier output precharge means further comprises means for clamping the complementary preamplifier outputs to the same signal level prior to the arrival of the complementary data signals. Preferably, the timing signals define a signal sense period and further including preamplifier output current control means responsive to the timing signal for preventing current from flowing in the preamplifier at a time not within the signal sense period. Preferably, the latch means has a pair of complementary latch nodes and further comprises means for latching one latch node at a high signal level appropriate for driving an output circuit and for latching the other latch node at a low signal level appropriate for driving the output circuit. Preferably, the amplifier further comprises a tristate output circuit for utilizing the signals on the latch nodes to produce a complementary pair of tristate output signals. Preferably, the tristate output circuit comprises a pair of complementary output terminals and tristate output precharge means responsive to the timing signal for creating a signal level on the complementary output terminals between the expected signal levels of the complementary pair of tristate output signals prior to the time the complementary data signals have separated sufficiently to latch the latch means. Preferably, the tristate output precharge means further comprises means for clamping the complementary output terminals to the same signal level prior to the time the complementary data signals have separated sufficiently to latch the latch means. Preferably, the sense amplifier further includes latch node precharge means responsive to the timing signal for creating a signal level on the complementary latch nodes between the high and low signal levels prior to the time the complementary data signals have separated sufficiently to latch the latch means. Preferably, the sense amplifier further includes output current control means responsive to the timing signal for placing the latch nodes in condition in which they draw no current.

In another aspect the invention provides an integrated circuit sense amplifier comprising: timing signal input means for receiving one or more timing signals; a pair of complementary inputs for receiving a pair of complementary data signals; latch means having a pair of complementary latch nodes and responsive to the complementary data signals for latching one latch node at a high signal level appropriate for driving an output circuit and for latching the other latch node at a low signal level appropriate for driving the output circuit; and latch node precharge means responsive to the timing signal for creating a signal level on the complementary latch nodes between the high and low signal levels prior to the time the complementary data signals have separated sufficiently to latch the latch means. Preferably, the latch comprises a flip-flop having a high side and a low side, and the node precharge means comprises a pull up transistor connected between the high side of the flip-flop and a source of a logic high voltage, the gate of the pull up transistor being controlled by the timing signal.

In yet another aspect the invention provides an integrated circuit sense amplifier comprising: timing signal means for receiving timing signals defining a signal sense period; a pair of complementary inputs for receiving a pair of complementary data signals; an output enable circuit including one or more first output enable transistors and one or more second output enable transistors, the gates of the first and second output enable transistors connected to the timing signal means; a latch means responsive to the complementary data signals for providing a complementary pair of latched output signals, the latch means comprising a first p-channel transistor in series with a first n-channel transistor and a second p-channel transistor in series with a second n-channel resistor, the connection between the first p-channel transistor and the first n-channel transistor defining a first latch node and the connection between the second p-channel transistor and the second n-channel transistor defining a second latch node, the sources of the n-channel transistors connected to a logic low voltage, the sources of the p-channel transistors connected to a logic high voltage through a first output enable transistor, the first and second latch nodes connected to a logic low voltage through a second output enable transistor, and the timing signal means further comprising means for turning the one or more first output enable transistors on at a time outside the signal sense period, for turning the one or more first output enable transistors off at the initiation of the sense period, for turning the one or more second output enable transistors off at a time outside the sense period, and for turning the one or more second output enable transistors on at the initiation of the sense period.

The invention not only provides a faster sense amplifier, but does so with a simpler circuit than prior art sense amplifiers. Numerous other features, objects and advantages of the invention will become apparent from the following description when read in conjunction with the accompanying drawings.

DESCRIPTION OF THE PREFERRED EMBODIMENT

1. Overview

Figure 1:
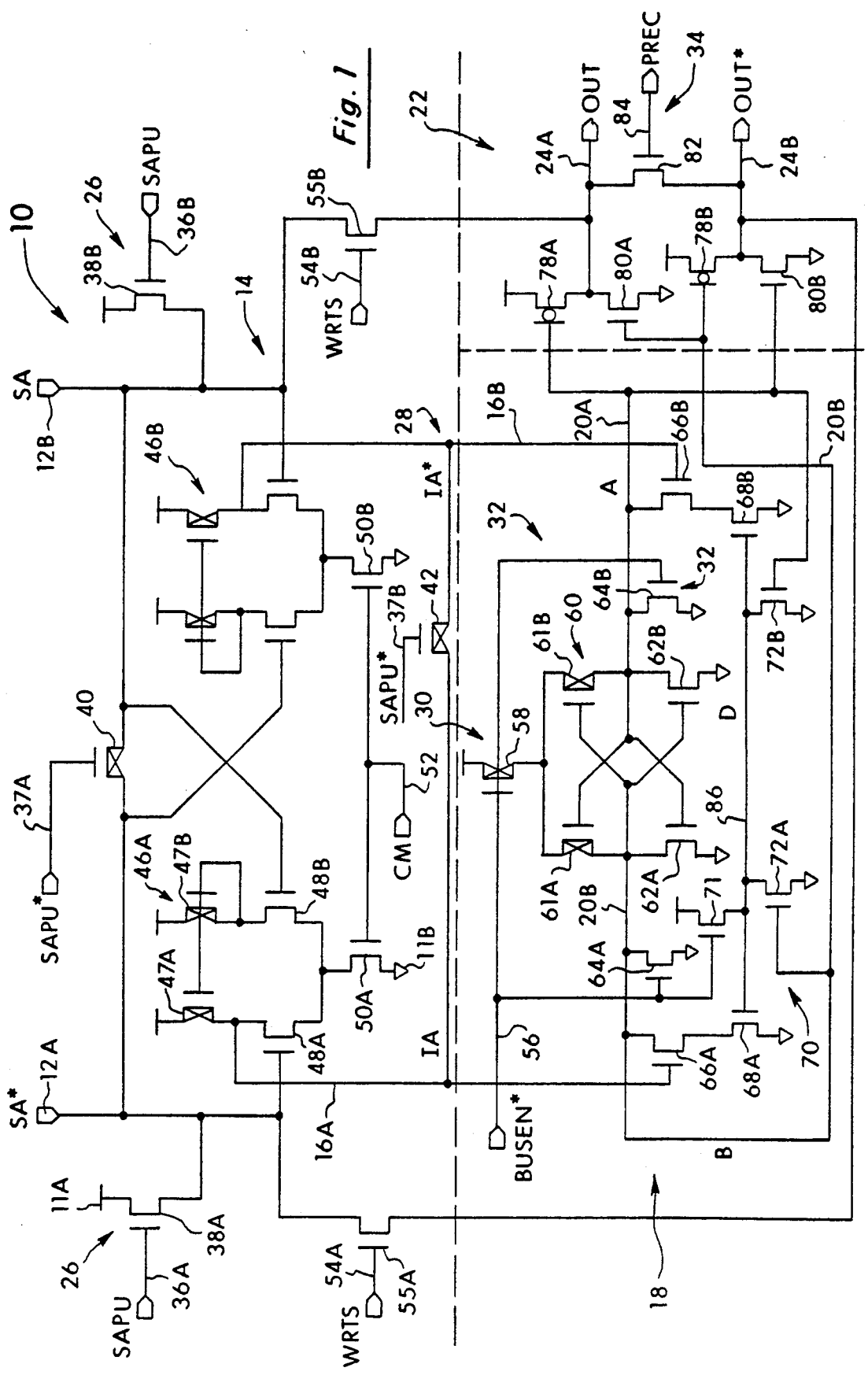
FIG. 1 is a circuit diagram of the preferred embodiment of an integrated circuit sense amplifier according to the invention.
Figure 2:
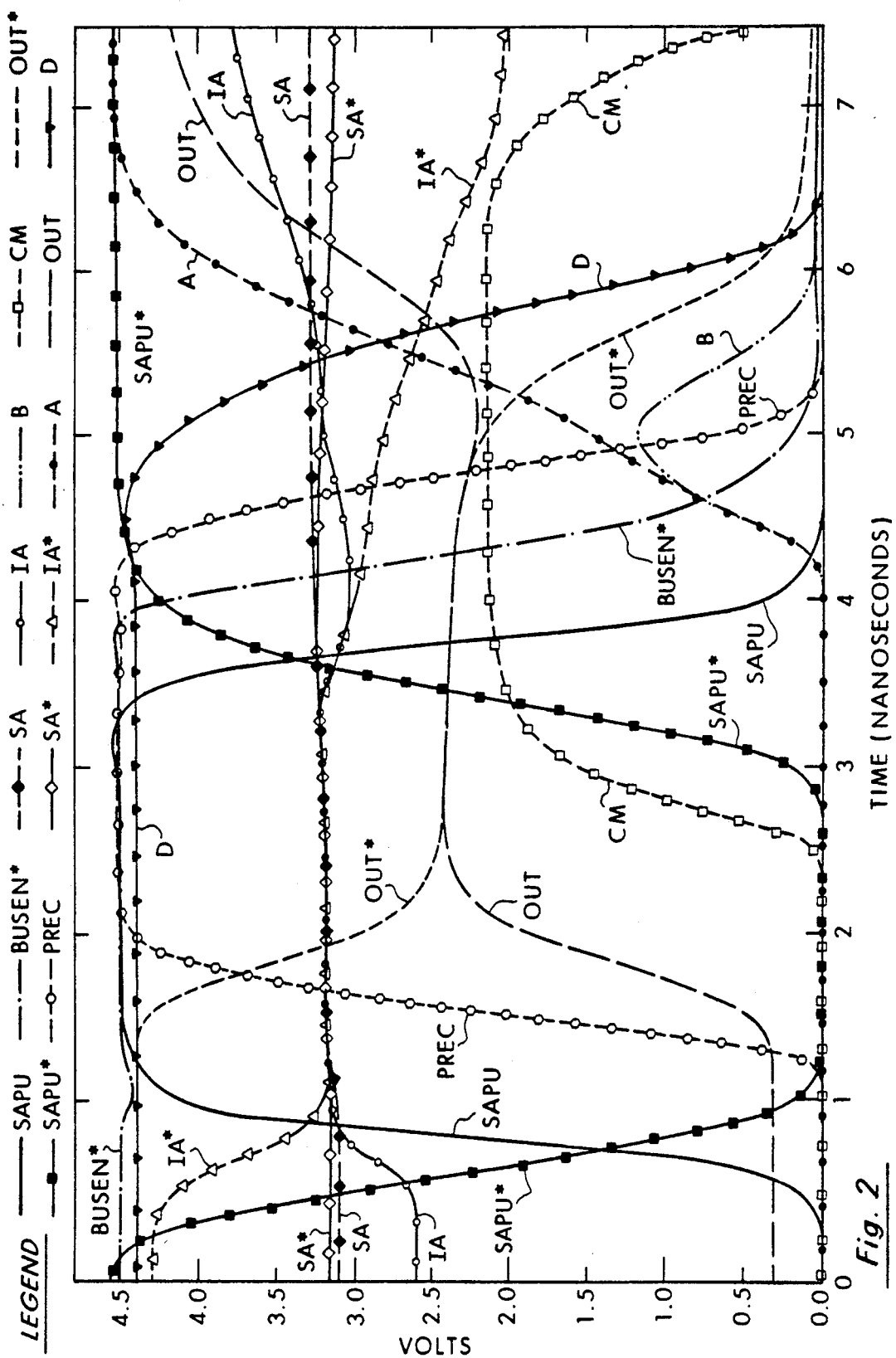
FIG. 2 is graph of a SPICE stimulation of the signals designated in FIG. 1.

Turning now to FIG. 1, there is shown a circuit diagram of an integrated circuit sense amplifier 10 according to the invention. The circuit includes n-channel transistors, such as 38A, low-threshold n-channel transistors, such as 78A, and p-channel transistors, such as 40. Connections to the nominal 5 volt (logic high) power supply are indicated by a line such as 11A, while connections to the ground voltage (logic low) are indicated by an inverted triangle, such as 11B. Amplifier 10 includes two amplification stages, a preamplifier stage 14 which essentially includes the circuitry above the dotted line, that is the circuitry from inputs 12A and 12B to preamp outputs 16A and 16B which carry signals IA and IA* respectively, and a latch stage which essentially includes the circuitry below and to the left of the dotted lines, that is the circuit between preamp outputs 16A and 16B and latch outputs 20A and 20B which carry signals A and B respectively. It also includes a tristate output circuit 22 which essentially includes the circuitry below and to the right of the dotted lines, that is the circuitry between latch outputs 20A and 20B and amplifier outputs 24A and 24B which carry the signals OUT and OUT* respectively. The preamplifier circuit 14 circuit includes a pair of complementary inputs 12A and 12B for receiving a pair of complementary data signals, SA* and SA (Sense Amp) respectively, and the latch circuit 18 includes a flip-flop 60 and current steering circuit 70. The sense amplifier 10 also incudes: an input precharge means 26 responsive to the SAPU (Sense Amp Pull Up) and SAPU* timing signals for creating a signal level on the complementary inputs 12A and 12B near the expected signal levels of the complementary data signals SA and SA* prior to the arrival of the complementary data signals; preamplifier output precharge means 28 responsive to the timing signal SAPU* for creating a signal level on outputs 16A and 16B between the expected signal levels of the preamplifier output signals IA and IA* prior to the arrival of the data signals SA and SA*; latch node precharge means 30 responsive to the BUSEN* (BUS ENable) timing signal for creating a signal level on the latch nodes 20A and 20B between the high and low signal levels prior to the time the data signals SA and SA* have separated sufficiently to latch the latch means 18; output current control means 32 responsive to the BUSEN* timing signal for placing the latch nodes 20A and 20B in a low current state; and tristate output precharge means 34 responsive to the PREC (PRECharge) timing signal for creating a signal level on the output terminals 24A and 24B between the expected signal levels of the tristate output signals OUT and OUT* prior to the time the complementary data signals SA and SA* have separated sufficiently to latch the latch means 18. A SPICE simulation of the SAPU, SAPU*, BUSEN*, PREC, SA, SA*, IA, IA*, B, A, OUT, and OUT* signals are shown in FIG. 2. SPICE is a well-known analog simulation of a circuit done on computer and is generally quite accurate. Approximately one cycle of the signals is shown. One cycle ends and the next begins with the falling of the SAPU* signal and the rising of the SAPU signal. These signals cause the clamping of SA and SA* together at a signal level of about 3.2 volts which is at or near their anticipated signal level when the data signal arrives. Thus they don't have far to move when the signal does arrive. Likewise the falling SAPU* signal clamps IA and IA* at about the same signal level, which is approximately halfway between their anticipated signal levels after SAPU* rises and the data signals SA and SA* separate. At about 1.2 nanoseconds into the cycle, PREC goes high, which clamps OUT and OUT* at a signal level of about 2.4 volts, which is about halfway between their anticipated signal levels after PREC falls and the signals SA and SA* separate. About 4 nanoseconds into the cycle BUSEN* begins to go low which causes A and B to begin to rise even before the signals SA and SA* have separated sufficiently for the sense amp 10 to respond. When SA and SA* do separate far enough to be distinguished, A and B separate, with one rising to the full nominal high voltage of 4.5 volts and the other falling to the full low voltage of 0 volts, i.e they "go to the rails". The various precharges allow all the signals to move as rapidly as possible to their ultimate values which makes the amplifier very fast. The latch output node signals A and B go completely to the rails which provides a crisp, full output with only two stages of amplification.

2. Detailed Description of the Circuits

Returning now to FIG. 1, sense amplifier 10 comprises sense amp inputs 12A and 12B; SAPU signal inputs 36A and 36B; SAPU* signal inputs 37A and 37B; sense amp pull up transistors 38A and 38B; sense amp signal clamping transistor 40; preamp output clamping transistor 42; differential amplifiers 46A and 46B each of which comprise two p-channel transistors 47A and 47B and two n-channel transistors 48A and 48B; differential amplifier current gate transistors 50A and 50B; CM signal input 52; WRTS (WRiTe Signal) signal inputs 54A and 54B; output terminal precharge gates 55A and 55B; BUSEN* signal input 56; flip-flop pull up transistor 58; flip-flop 60 comprising first p-channel transistor 61A, second p-channel transistor 61B, first n-channel transistor 62A, and second n-channel transistor 62B; latch node pull down transistors 64A and 64B; latch input transistors 66A and 66B; a latch current steering circuit 70 comprising latch input pull down transistors 68A and 68B, pull up transistor 71, pull down transistors 72A and 72B, and tristate output circuit 22 comprising pull up transistors 78A and 78B, pull down transistors 80A and 80B, precharge gate transistor 82, output terminals 24A and 24B, and precharge signal input 84.

In the embodiment of FIG. 1, sense amp input pull up transistors 38A and 38B are n-channel transistors. These transistors as well as the other n-channel transistors designated by the same symbol have threshold voltages of about 1 volt. Thus they will have a voltage drop across them of about 1 volt and thus the signals that pass through them will be about one volt less than signals that pass through a p-channel transistor. N-channel transistors that have a small circle between the gate and source/drain portions, such as transistor 78A, are low threshold n-channel transistors, that have thresholds of about 0.1 volt to 0.2 volt. Thus they will have a voltage drop across them of about 0.1 volt to 0.2 volts. It is also noted that, in the embodiment of FIG. 1, the SA and SA* signals are biased to a voltage that is one n-channel threshold below the nominal voltage. Transistors 38A and 38B have their gates connected to the SAPU signal inputs 36A and 36B respectively, their drains connected to the high logic voltage, and their sources connected to the data signal inputs 12A and 12B respectively. Sense amp input clamping transistor 40 is preferably a p-channel transistor having it is gate connected to the SAPU* signal input 37A and its source and drain connected to inputs 12A and 12B. Data signal input 12A is connected to the drain of n-channel transistor 48A in differential amplifier 46A and to amplifier output 24B through n-channel transistor 55A. P-channel transistors 47A and 47B in differential amplifier 47B each have their sources connected to the high voltage and each of n-channel transistors 48A and 48B have their sources connected to the low logic voltage through n-channel transistor 50A. The drains of transistors 47B and 48B are connected together and to the gates of transistors 47A and 47B, while the gate of transistor 48B is connected to data signal input 12B. The gate of transistor 50A is connected to the CM signal input 52. The drains of transistors 47A and 48A are connected together and to the preamplifier output 16A which is connected to the gate of transistor 66A to provide one of the complementary inputs to latch 18. Differential amplifier 46B is similarly connected through n-channel transistors 38B, 50B, and 54B, and to data input 12A to provide the other preamplifier output 16B, which is connected to the gate of transistor 66B to provide the other complementary input to latch 18. Preamp output clamping transistor 42 is preferably a p-channel transistor with its source and drain connected across preamplifier outputs 16A and 16B and its gate connected to the SAPU* signal input 37B. P-channel transistors 61A and 61B in flip-flop 60 have their sources connected to the logic high voltage through p-channel transistor 58, the gate of which is connected to the BUSEN* input 56. N-channel transistors 62A and 62B of flip-flop 60 have their sources connected to the low logic voltage. The drains of transistors 61A and 62A are connected together and to the gates of transistors 61B and 62B to one of the latch output nodes 20B, while the drains of transistors 61B and 62B are connected together and to the gates of transistors 61A and 62A to form the other of the latch output nodes 20A. Node 20B is connected to the low logic voltage through n-channel transistor 64A and also through n-channel transistors 66A and 68A connected in series. The gate of transistor 64A is connected to the BUSEN* input 56, and the gate of transistor 68A is connected to latch current steering node 86. Likewise latch output node 20A is connected to the low logic voltage through n-channel transistor 64B and also through n-channel transistors 66B and 68B connected in series. The gate of transistor 64B is connected to the BUSEN* input 56, and the gate of transistor 68B is connected to latch current steering node 86. Node 86 is connected to the high logic voltage through n-channel transistor 71, the gate of which is connected to the BUSEN* input 56; Node 86 is also connected to ground through n-channel transistors 72A and 72B. The gate of transistor 72A is connected to latch node 20B, while the gate of transistor 72B is connected to latch node 20B. Latch node 20B is also connected to the gates of n-channel transistors 78B and 80A. Latch node 20A is also connected to the gates of n-channel transistors 78A and 80B. Output 24A is connected to the logic high voltage through n-channel transistor 78A and to the logic low voltage through n-channel transistor 80A. Output 24B is connected to the logic high voltage through n-channel transistor 78B and to the logic low voltage through n-channel transistor 80B. Outputs 24A and 24B are connected through n-channel transistor 82, the gate of which is connected to the PREC signal input 84.

The function of sense amplifier 10 can best be understood by a discussion of the circuitry of FIG. 1 together with the signals shown in FIG. 2. At the beginning of a cycle, BUSEN* is high, thus transistors 64A and 64B are on, clamping signals A and B on nodes 20A and 20B low. Nodes 20A and 20B being low also means p-channel transistors 61A and 61B are on and n-channel transistors 62A and 62B are off. Current does not flow through p-channel transistors 61A and 61B, even though nodes 20A and 20B are low, because BUSEN* being high holds transistor 58 off. BUSEN* being high also turns on transistor 71, clamping signal D on node 86 high. Current does not flow to ground from node 86 however, because nodes 20B and 20A are low and transistors 72A and 72B are off. Current cannot flow in preamp 14 either because CM is low and transistors 50A and 50 B are off, and SAPU is low holding transistors 38A and 38B off. Almost immediately after the beginning of the cycle, SAPU goes high and SAPU* goes low. SAPU going high turns on transistors 38A and 38B which forces inputs 12A and 12B high. At approximately the same time, SAPU* going low turns on transistor 40 which shorts input 12A to input 12B, clamping their voltages together. Since the signal from nominal high voltage source 11A passes through transistor 38A, the clamping voltage will be about one n-channel threshold below the nominal voltage, which is approximately the nominal level of the SA and SA* signals. The low SAPU* signal also turns on transistor 42 which clamps together preamplifier outputs 16A and 16B. Since inputs 12A and 12B are clamped at a voltage above the threshold voltage of transistors 48A and 48B, these transistors and their counterparts in differential amplifier 46B are on, however CM is low so transistors 50A and 50B will be off, and there is no current path to ground, and thus IA and IA* will be clamped at a voltage about halfway between their values in the previous cycle, though in practice it is a little less because of significant circuit capacitance. Between 1 nanosecond and 2 nanoseconds, PREC goes high, which turns on transistor 82 and clamps OUT and OUT* together. Since transistors 78A, 78B, 80A, and 80B are all off, OUT and OUT* are clamped at a voltage about half way between their values at the end of the previous cycle. Between 2 nanoseconds and 3 nanoseconds, CM rises. This turns on gates 50A and 50B, dropping the voltage in the circuits of differential amplifiers 46A and 46B sufficiently to turn on transistors 47A and 47B and their counterparts in differential amplifier 46B and lets current flow through the differential amplifiers. IA and IA* begin to drop, but almost immediately, SAPU* begins to rise and SAPU begins to fall, releasing the voltage in inputs 12A and 12B and outputs 16A and 16B. SA and SA* begin to separate, followed by IA and IA*, since differential amplifiers 46A and 46B are on. Before SAPU and SAPU* have reached their full voltages, BUSEN* begins to drop, turning off transistors 64A, 64B, and 71 and turning on transistor 58. Immediately, nodes 20B and 20A are pulled high through p-channel transistors 61A and 61B causing signals A and B to rise. Shortly after BUSEN* goes low, PREC begins to fall also. This turns off transistor 82, releasing OUT and OUT*. Before A and B can rise to the full voltage, IA and IA* have separated enough to drive flip-flop 60, which is on. The circuit has been designed so that both IA and IA* are high enough to turn on their corresponding input transistors 66A and 66B respectively. Whichever one of IA and IA* is higher, causes the corresponding transistor 66A or 66B conduct more current, and thus causes the corresponding one of nodes 20B or 20A to rise slower. In the simulation of FIG. 2, IA is higher, and thus node 20B rises slower. This causes transistor 61B to conduct more current than transistor 61A and transistor 62B to conduct less current than transistor 62A. Thus node 20A rises even faster than node 20B, causing node 61A to conduct even more current than transistor 61B and transistor 62A to conduct even more current than transistor 62B. The above actions feed back into each other, causing A to go high and B to go low, latching flip-flop 60. IA and IA* continue separating as SA and SA* continue to separate, but the low one, IA* in FIG. 2, does not get low enough to turn off its gate 66B. Thus node A would be continually pulled low through it, except for the current steering circuit 70. B going low causes gate 72A to turn off, but A going high turns gate 72B on. Thus, node 86 and signal D goes low, turning off transistors 68A and 68B. If A goes low and B goes high, then transistor 72 turns on and pulls node 86 and signal D low. This prevents the high one of nodes 20A and 20B from being pulled low due to the fact that the one of IA and IA* that goes low does not go low enough to turn off its corresponding transistor 66A or 66B. Thus the high signal of A and B, (A in the simulation of FIG. 2) can go to the rails. A going high turns on transistors 78A and 80B, while B going low, holds off transistors 80A and 78B. Thus, output terminal 24A and the OUT signal are pulled high, while output terminal 24B and the OUT* signal are pulled low. Since transistors 78A and 78B are low threshold transistors, the one of OUT and OUT* to go high, goes higher than it would if the transistors were transistors of ordinary threshold. However, since A is pulled high through p-channel transistors, which have negligible vol. drop, it goes higher than OUT. Once A and B separate sufficiently to latch 18, CM goes low, turning off preamplifier 14.

Figure 3:
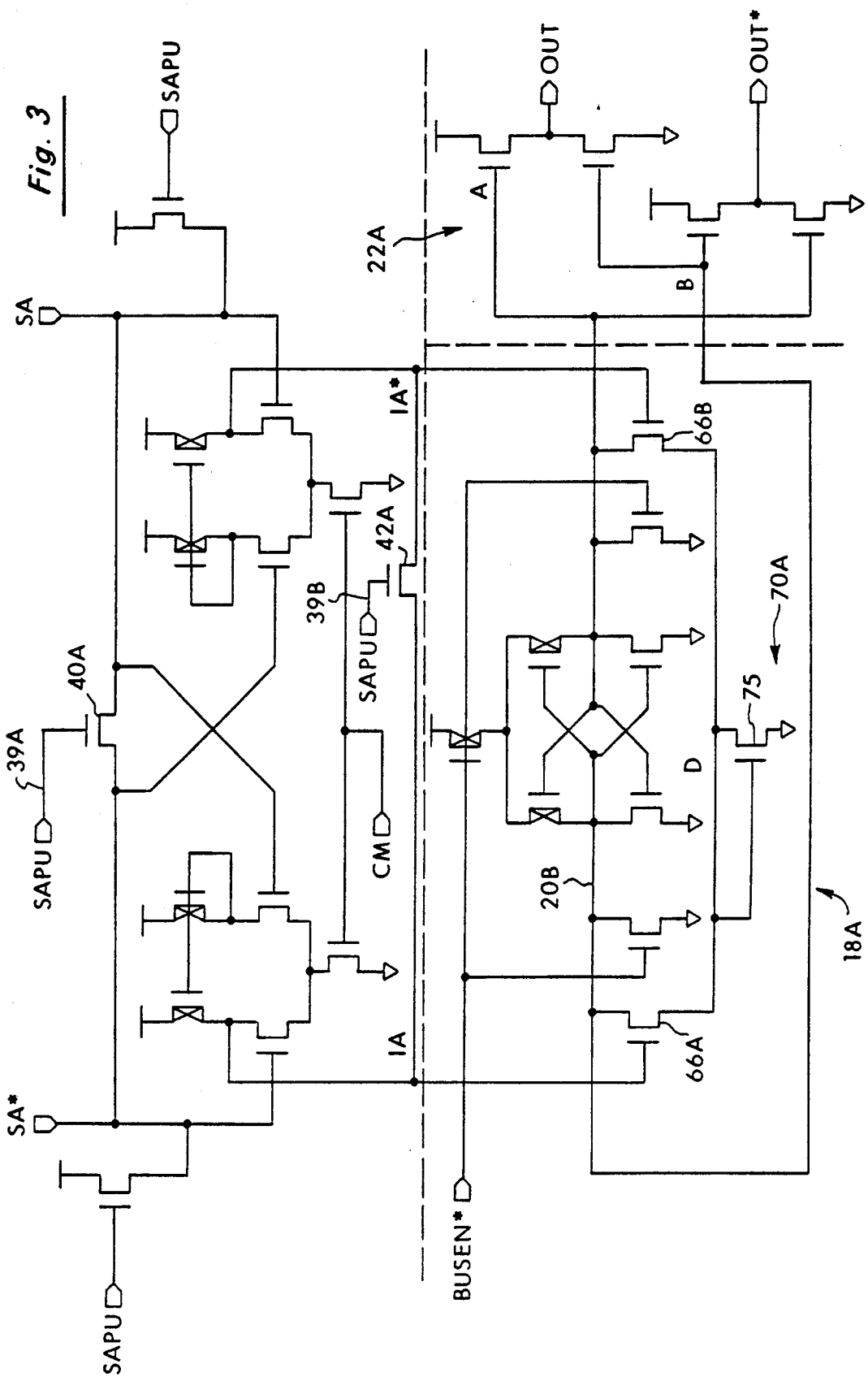
FIG. 3 is a circuit diagram an alternative preferred embodiment of an integrated circuit sense amplifier according to the invention.

Turning now to FIG. 3 a variation of the circuit of 1 is shown. In the discussion of this figure as well as FIGS. 4, 5, and 6, we shall focus on the differences between the embodiments described therein and the embodiments previously described, and not repeat the discussion of what is the same. The components that are exactly the same, and perform the same function are referred to by the same numerals for clarity. The embodiment of FIG. 3 is the same as the embodiment of FIG. 1 except that: The SAPU signal is input into inputs 39A and 39B as compared to the SAPU* signal in the corresponding inputs 37A and 37B in FIG. 1, and the transistors 40A and 42A are n-channel transistors as compared to the p-channel transistors 40 and 42 in FIG. 1. The current steering circuit 70 of FIG. 1 has been replaced by the simpler circuit of transistor 75. The gate of transistor 75 is connected to its source and to the sources of transistors 66A and 66B; Transistor 82 and the PREC signal are not provided in the tristate output circuit 22A; The WRTS inputs and the associated circuitry are not shown.

The circuit of FIG. 3 operates the same as the circuit of FIG. 1 except for the following differences. No SAPU* signal is required, since the transistors 40A and 42A are n-channel. BUSEN* does not start to go high until about the second nanosecond, after SAPU has gone high and SA and SA* and IA and IA* have been clamped together. A and B split a little less swiftly, so that it takes about an additional half-nanosecond to reach the full logic signal state, and, perhaps because the current steering circuit 70A doesn't quite turn off the one of gates 66A and 66B that connects to the high voltage, the high one of signals A and B doesn't quite go as high, rising to about 4.3 volts rather than 4.4 volts, though it does go high enough to appropriately operate the output circuit 22A and to be considered a full logic signal.

Figures 4A, 4B:
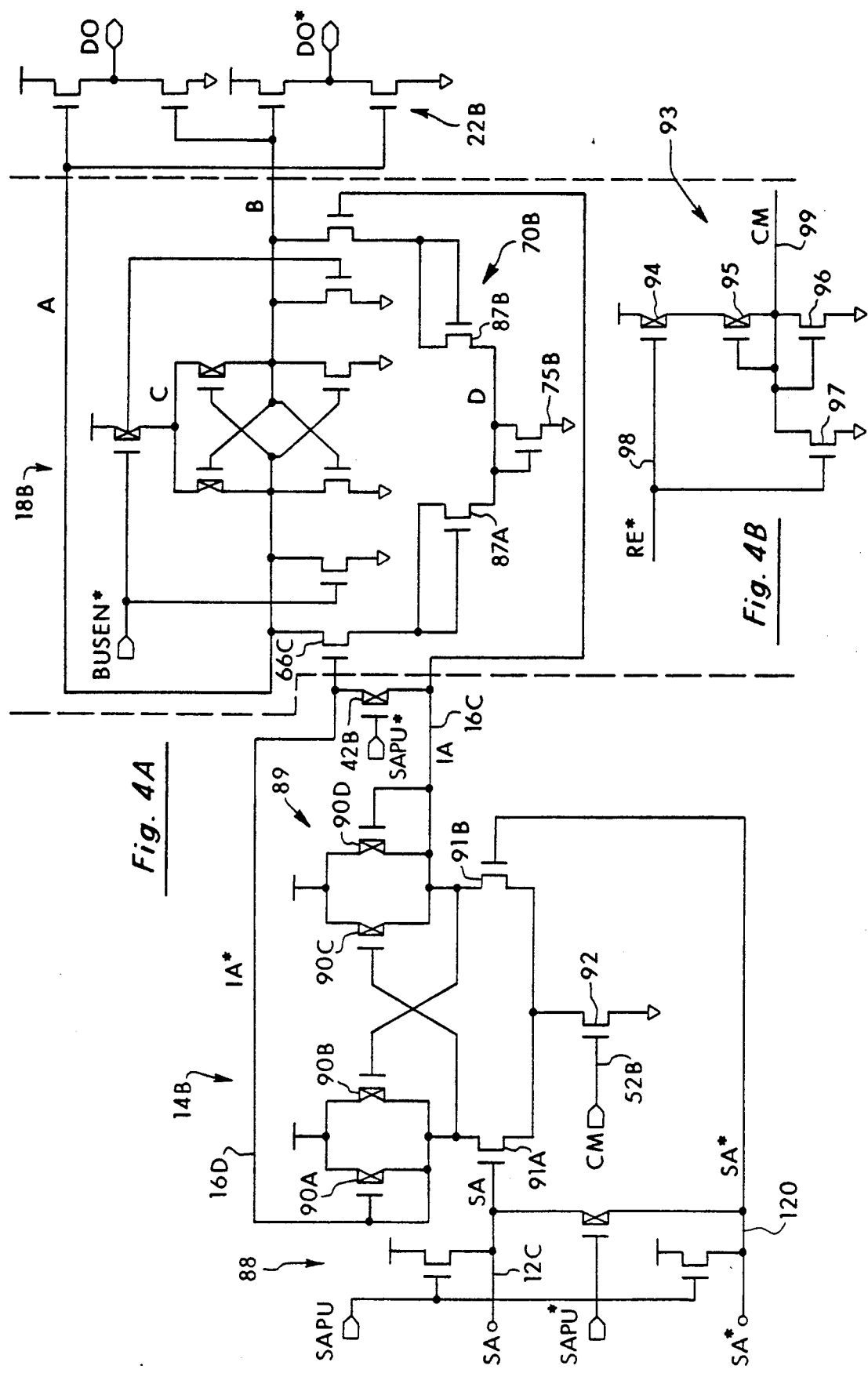
FIG. 4A is a circuit diagram on another preferred embodiment of an integrated circuit sense amplifier according to the invention.
FIG. 4B is a circuit diagram of a subcircuit which generates the CM signal of FIG. 4A.

The embodiment of FIG. 4 also is a two stage sense amplifier circuit, including a preamplifier stage 14B which essentially includes the circuitry to the left of the leftmost dotted line, a latch stage 18B which includes the circuitry between the dotted lines, and a tristate output 22B, which includes the circuitry to the right of the rightmost dotted line. The tristate output circuit 22B is the same as the tristate output circuit 22A in FIG. 3. The latch stage 18B is the same as the latch stage 18A of the embodiment of FIG. 3, except that the current steering circuit includes two additional n-channel transistors 87A and 87B. The drain of transistor 75B is connected to the sources of transistors 87A and 87B as well as to its own gate, and the drains of transistors 87A and 87B are connected to the sources of the latch input transistors 66C and 66D, respectively, as well as their own gates. The input portion of preamplifier 14B in FIG. 4A is the same as the corresponding input in the embodiment of FIG. 1. as is the preamp output precharge transistor 42B. The differential amplifier portion 89 comprises p-channel transistors 90A, 90B, 90C, and 90D and n-channel transistors 91A, 91B, and 91C. The sources of transistors 90A and 90B are connected to the logic high voltage and their drains are connected to one preamplifier output node 16D; the sources of transistors 90C and 90D are also connected to the logic high voltage while their drains are connected to the other preamplifier output 16C. Node 16D is also connected to the gates of transistors 90A and 90C and the drain of transistor 91A, while the node 16C is also connected to the gates of transistors 90B and 90D and the drain of transistor 91B. The sources of transistors 91A and 91B are connected to the drain of transistor 92, while their gates are connected to the SA and SA* inputs 12C and 12D respectively. The source of transistor 92 is connected to the logic low voltage while its drain is connected to the CM signal input 52B.

The circuit of FIG. 4A operates similarly to the circuit of FIG. 3 except that the gain of the dual differential amplifiers is not as high as those of FIG. 3. Since the amplification is less, the intermediate nodes signals IA and IA* do not separate as much and the low one of the intermediate node signals IA and IA* does not go as low in this embodiment. Thus an additional level 87A and 87B of current steering transistors is added that drops the voltage an additional transistor voltage threshold, allowing the low one of transistors 66C and 66D to shut off, thus allowing the corresponding signal A or B to rise to the rail despite the decreased preamplification.

FIG. 4B shows the preferred embodiment of a circuit 93 for generating the intermediate level voltage CM, used in the circuits of FIGS. 1, 3, and 4, from a high level signal, such as the RE* (REad) signal, that arrives from the timing means in a typical integrated circuit. Circuit 93 comprises p-channel transistors 94 and 95 and n-channel transistors 96 and 97. The signal input 98 is connected to the gates of transistors 94 and 97. The source of transistor 94 is connected the logic high voltage and the drain is connected to the source of transistor 95. The source of transistor 97 is connected to the logic low voltage and the drain is connected to the gates of transistors 95 and 96 as well as the CM signal output 99. The source of transistor 96 is connected to the logic low voltage; the drains of transistors 95 and 96 are also connected to the output 99. The operation of the circuit of FIG. 4B is as follows. RE* starts high, turning off transistor 94 and turning on transistor 97, which pulls CM low, holds transistor 96 off, and holds transistor 95 on. When RE* goes low, transistor 94 turns on and transistor 97 turns off. Since CM is low, transistor 95 remains on and CM is pulled up turning transistor 96 partially on. As CM is pulled up, transistor 95 turns partially off. The circuit reaches a balance point with the current through transistors 95 and 96 being equal. The transistors 95 and 96 are selected so the balance is reached with CM at about half the full logic high voltage.

Figure 5:
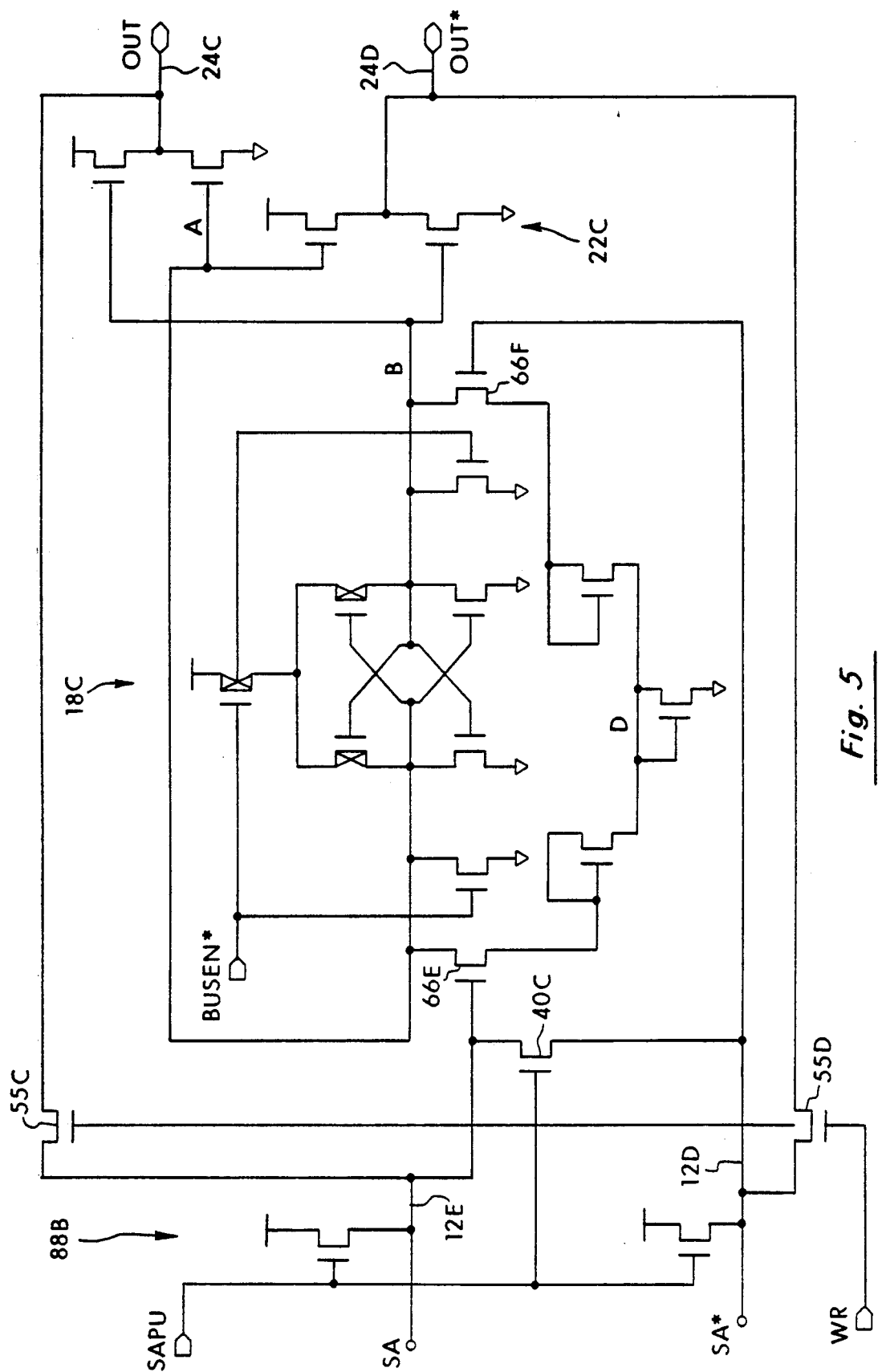
FIG. 5 is a circuit diagram of still another preferred embodiment an integrated circuit sense amplifier according to the invention.

FIG. 5 shows another preferred embodiment of the invention. In this embodiment the latch stage 18C and the tristate output 22C are exactly the same as in FIG. 4B. However, there is no preamplifier stage. The input portion 88B is connected directly to the latch stage 18C. The input portion 88B is the same as the input portion 88 of FIG. 4A, except that input clamping transistor 40C is an n-channel transistor, thus only the SAPU signal is needed. Complementary inputs 12E and 12D connect directly to the gates of the latch input transistors 66E and 66F respectively. In this embodiment the circuit that connects the inputs 12E and 12F to the outputs 24C and 24D during the write cycle via transistors 55C and 55D, corresponding to the same circuit in FIG. 1, is also shown. This embodiment is effective in sending the signals A and B to the rails in one stage if the signals SA and SA* are not too small. By eliminating the first stage, the time for the first stage to respond also has been eliminated. Thus this amplifier is extremely fast, and may be faster than the embodiment of FIG. 1 in some applications.

A feature of the sense amplifier of the invention is that a latch 18 is used in place of the second stage amplifier of prior art circuits. This causes the output to go to the rails with no further amplification stages.

A related feature of the invention is that from a very small input signal it provides a full logic output appropriate or driving a tristate output with two or less stages of amplification.

Another feature of the invention is that the latch 18 is clocked so that it is up and operating when the signal to be amplified arrives. A related feature is that the important nodes in the circuit are precharged at or near the levels they will reach when the signal is sensed and amplified. Thus all signals reach their nominal levels very quickly, and the sense amplifier of the invention is very fast. As can be seen from FIG. 2, the time from when the SA/SA* signal separates until there is a useful signal at outputs 24A and 24B is about 2 nanoseconds. Under some conditions even faster times have been recorded. Thus the sense amplifier of the invention is from 1 to 3 nanoseconds faster than prior art sense amplifiers.

A further feature of the invention is that it draws no current when a signal is not being sensed. This makes it extremely useful in low current applications. A related feature to the above features is that the amplifier of the invention is very quick to provide a useful output from a quiescent state in which it draws no current.

Another feature of the invention is that the circuit is very simple. Only two stages are used, which eliminates an additional stage of prior art sense amplifiers. Further, the latch used is simpler than prior art amplifier stages used in sense amplifiers. Overall, the circuit provides significant size reduction over prior art sense amplifiers.

A further feature of the invention is that it draws unusually small current. As discussed above, when no signal is being sensed, it draws no current. However, even when a signal is being sensed it still draws significantly less current than prior art sense amplifiers because it has less amplification stages, and a latch is a very efficient electrical component.

There has been described a novel integrated circuit sense amplifier which is extremely fast, unusually simple and which has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to use a latch in place of an amplifier stage in a sense amplifier, other designs incorporating latches may be substituted. The invention may also be used in other situations where a sense amplifier for that can sense a very small signal quickly and can be fabricated in a small area on a semiconductor chip will be useful. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the sense amplifier described.

What is claimed is:

1. An integrated circuit sense amplifier comprising:
   timing signal input means for receiving one or more timing signals;
   a pair of complementary inputs for receiving a complementary pair of data signals;
   an output circuit having a pair of complementary outputs wherein the complementary outputs are electrically separate from the complementary inputs;
   input precharge means responsive to said timing signal for creating a signal level on said complementary inputs near the expected signal levels of said complementary data signals prior to the arrival of said complementary data signals;
   a preamplifier coupled to said complementary inputs and having a pair of preamplifier outputs, and including means for preamplifying said complementary data signals to produce a complementary pair of preamplifier output signals on said preamplifier outputs, wherein said preamplifier output signals are less than full logic signals; and
   latch means responsive to said preamplifier output signals for producing a full logic output signal.

2. An integrated circuit sense amplifier as in claim 1 wherein said input precharge means further comprises means for clamping said complementary inputs to the same signal level prior to the arrival of said complementary data signals.

3. An integrated circuit sense amplifier comprising:
   timing signal input means for receiving one or more timing signals;
   a pair of complementary inputs for receiving a complementary pair of data signals;
   input precharge means responsive to said timing signal for creating a signal level on said complementary inputs near the expected signal levels of said complementary data signals prior to the arrival of said complementary data signals;
   latch means responsive to said complementary data signals for producing a full logic output signal
   a preamplifier located between said complementary inputs and said latch means, having a pair of preamplifier outputs, and including means for preamplifying said complementary data signals to produce a complementary pair of preamplifier output signals on said preamplifier outputs; and
   preamplifier output precharge means responsive to said timing signal for creating a signal level on said preamplifier outputs between the expected signal levels of said complementary preamplifier output signals prior to the arrival of said complementary data signals.

4. An integrated circuit sense amplifier as in claim 3 wherein said preamplifier output precharge means further comprises means for clamping said complementary preamplifier outputs to the same signal level prior to the arrival of said complementary data signals.

5. An integrated circuit as in claim 3 and wherein said timing signals define a signal sense period and further including preamplifier output current control means responsive to said timing signal for preventing current from flowing in said preamplifier at a time not within said signal sense period.

6. An integrated circuit sense amplifier as in claim 1 wherein said latch means has a pair of complementary latch nodes and further comprises means for latching one latch node at a high signal level appropriate for driving an output circuit and for latching the other latch node at a low signal level appropriate for driving said output circuit.

7. An integrated circuit sense amplifier comprising:
   timing signal input means for receiving one or more timing signals;
   a pair of complementary inputs for receiving a complementary pair of data signals;
   input precharge means responsive to said timing signal for creating a signal level on said complementary inputs near the expected signal levels of said complementary data signals prior to the arrival of said complementary data signals;
   latch means responsive to said complementary data signals for producing a full logic output signal, wherein said latch means has a pair of complementary latch nodes and further comprises means for latching one latch node at a high signal level appropriate for driving an output circuit and for latching the other latch node at a low signal level appropriate for driving said output circuit; and
   a tristate output circuit for utilizing the signals on said latch nodes to produce a complementary pair of tristate output signals.

8. An integrated circuit sense amplifier as in claim 7 wherein said tristate output circuit comprises a pair of complementary output terminals and tristate output precharge means responsive to said timing signal for creating a signal level on said complementary output terminals between the expected signal levels of said complementary pair of tristate output signals prior to the time said complementary data signals have separated sufficiently to latch said latch means.

9. An integrated circuit sense amplifier as in claim 8 wherein said tristate output precharge means further comprises means for clamping said complementary output terminals to the same signal level prior to the time said complementary data signals have separated sufficiently to latch said latch means.

10. An integrated circuit sense amplifier comprising:
    timing signal input means for receiving one or more timing signals;
    a pair of complementary inputs for receiving a complementary pair of data signals;
    input precharge means responsive to said timing signal for creating a signal level on said complementary inputs near the expected signal levels of said complementary data signals prior to the arrival of said complementary data signals;
    latch means responsive to said complementary data signals for producing a full logic output signal, wherein said latch means has a pair of complementary latch nodes and further comprises means for latching one latch node at a high signal level appropriate for driving an output circuit and for latching the other latch node at a low signal level appropriate for driving said output circuit; and
    latch node precharge means responsive to said timing signal for creating a signal level on said complementary latch nodes between said high and low signal levels prior to the time said complementary data signals have separated sufficiently to latch said latch means.

11. An integrated circuit sense amplifier as in claim 10 and further including output current control means responsive to said timing signal for placing said latch nodes in a low current state.

12. An integrated circuit sense amplifier as in claim 11 wherein said output current control means comprises means for holding said latch nodes at a low logic level whenever said latch output precharge means is not operating and said complementary data signals are not being amplified.

13. An integrated circuit sense amplifier comprising:
   timing signal input means for receiving one or more timing signals;
   a pair of complementary inputs for receiving a pair of complementary data signals;
   an output circuit having a pair of complementary outputs wherein the complementary outputs are electrically separate from the complementary inputs;
   latch means having a pair of complementary latch nodes and responsive to said complementary data signals for latching one latch node at a high signal level appropriate for driving said output circuit and for latching the other latch node at a low signal level appropriate for driving said output circuit; and
   latch node precharge means responsive to said timing signal for creating a signal level on said complementary latch nodes between said high and low signal levels prior to the time said complementary data signals have separated sufficiently to latch said latch means.

14. An integrated circuit sense amplifier comprising:
   timing signal input means for receiving one or more timing signals;
   a pair of complementary inputs for receiving a pair of complementary data signals;
   latch means having a pair of complementary latch nodes and responsive to said complementary data signals for latching one latch node at a high signal level appropriate for driving an output circuit and for latching the other latch node at a low signal level appropriate for driving said output circuit; and
   latch node precharge means responsive to said timing signal for creating a signal level on said complementary latch nodes between said high and low signal levels prior to the time said complementary data signals have separated sufficiently to latch said latch means; and
   output current control means responsive to said timing signal for placing said latch nodes in a low current state.

15. An integrated circuit sense amplifier as in claim 14 wherein said output current control means comprises means for holding said latch outputs at a logic low level whenever said latch output precharge means is not operating and said complementary data signals are not being amplified.

16. An integrated circuit sense amplifier comprising:
   timing signal input means for receiving one or more timing signals;
   a pair of complementary inputs for receiving a pair of complementary data signals;
   latch means having a pair of complementary latch nodes and responsive to said complementary data signals for latching one latch node at a high signal level appropriate for driving an output circuit and for latching the other latch node at a low signal level appropriate for driving said output circuit, wherein said latch means comprises a flip-flop having a high side and a low side, and said node precharge means comprises a pull up transistor connected between said high side of said flip-flop and a source of a logic high voltage, the gate of said pull up transistor being controlled by said timing signal; and
   latch node precharge means responsive to said timing signal for creating a signal level on said complementary latch nodes between said high and low signal levels prior to the time said complementary data signals have separated sufficiently to latch said latch means.

17. An integrated circuit sense amplifier comprising:
   timing signal means for receiving timing signals defining a signal sense period;
   a pair of complementary inputs for receiving a pair of complementary data signals;
   an output enable circuit including one or more first output enable transistors and one or more second output enable transistors, the gates of said first and second output enable transistors connected to said timing signal means;
   a latch means responsive to said complementary data signals for providing a complementary pair of latched output signals, said latch means comprising a first p-channel transistor in series with a first n-channel transistor and a second p-channel transistor in series with a second n-channel resistor, the connection between said first p-channel transistor and said first n-channel transistor defining a first latch node and the connection between said second p-channel transistor and said second n-channel transistor defining a second latch node, the sources of said n-channel transistors connected to a logic low voltage, the sources of said p-channel transistors connected to a logic high voltage through a first output enable transistor, the first and second latch nodes connected to a logic low voltage through a second output enable transistor, and
   said timing signal means further comprising means for turning said one or more first output enable transistors on at a time outside said signal sense period, for turning said one or more first output enable transistors off at the initiation of said sense period, for turning said one or more second output enable transistors off at a time outside said sense period, and for turning said one or more second output enable transistors on at the initiation of said sense period.

* * * * *